United States Patent [19]

Brady et al.

[11] Patent Number: 5,358,879
[45] Date of Patent: Oct. 25, 1994

[54] METHOD OF MAKING GATE OVERLAPPED LIGHTLY DOPED DRAIN FOR BURIED CHANNEL DEVICES

[75] Inventors: Frederick T. Brady, Chantilly; Charles P. Breiten, Culpeper; Nadium F. Haddad, Oakton; William G. Houston, Elkwood; Oliver S. Spencer, Manassas; Steven J. Wright, Fredericksburg, all of Va.

[73] Assignee: Loral Federal Systems Company, Bethesda, Md.

[21] Appl. No.: 54,994

[22] Filed: Apr. 30, 1993

[51] Int. Cl.$^5$ .................................... H01L 21/266
[52] U.S. Cl. .................................... 437/44; 437/21; 437/24; 148/DIG. 114
[58] Field of Search .................. 437/21, 24, 29, 30, 437/44, 150, 191, 978; 148/DIG. 43, DIG. 112, DIG. 114

[56] References Cited

U.S. PATENT DOCUMENTS

| | | | |
|---|---|---|---|
| 4,053,925 | 10/1977 | Burr et al. | 437/24 |
| 4,069,068 | 1/1978 | Beyer et al. | 437/931 |
| 4,753,896 | 6/1988 | Matloubian | 437/21 |
| 4,908,326 | 3/1990 | Ma et al. | 437/44 |
| 4,928,156 | 5/1990 | Alvis et al. | 257/344 |
| 4,971,922 | 11/1990 | Watabe et al. | 437/29 |
| 4,975,385 | 12/1990 | Beinglass et al. | 437/44 |
| 5,015,598 | 5/1991 | Verhaar | 437/191 |
| 5,030,582 | 7/1991 | Miyajima et al. | 437/44 |
| 5,091,763 | 2/1992 | Sanchez | 437/29 |
| 5,234,850 | 8/1993 | Liao | 437/44 |

OTHER PUBLICATIONS

Ghandhi, S. K., "VLSI Fabrication Principles", pp. 337–340, 1983.
Simple Gate-To-Drain Overlapped MOSFET's, Ih-Chin Chen et al., IEEE, Electron Device Letters, vol. 11, No. 2, Feb. 1990.
A Self-Aligned Inverse-T Gate Fully Overlapped . . . D. S. Wen et al., IEEE 1989 (IEDM).
A Highly Reliable 0.3 μm M–Channel MOSFET . . . I. C. Chen et al.., IEEE 1990, Symposium on VLSI Technology.
Graded-Junction Gate/N Overlapped LDD MOSFET, Yoshinori Okumura, et al., IEEE Transactions on Electron Devices, vol. 38, No. 12, Dec. 1991.

*Primary Examiner*—Tom Thomas
*Assistant Examiner*—Chandra Chaudhari
*Attorney, Agent, or Firm*—Mark A. Wurm

[57] ABSTRACT

A process to form poly sidegate LDD structures on buried channel MOSFETs is described. A polysilicon spacer is formed on the gate after source/drain processing. The spacer is later shorted to the main gate by implantation of neutral impurities. The process is particularly suited for SOI technology.

3 Claims, 7 Drawing Sheets

METHOD OF MAKING GATE OVERLAPPED LIGHTLY DOPED DRAIN FOR BURIED CHANNEL DEVICES

BACKGROUND OF THE INVENTION

The invention relates to a method for improving buried channel integrated circuit devices, and more specifically, to a method for producing reduced size semiconductor devices having reduced electric fields and high breakdown voltages.

To continuously improve performance, the size of semiconductor devices has been steadily scaled down. The physics of the scaling laws are complex. But for MOSFETs (Metal Oxide Silicon Field Effect Transistors), a major limiting factor is the presence of high electric fields. The electric field maximum tends to occur around the body/drain junction near the silicon/silicon dioxide interface, just below the edge of the gate. This high electric field can cause reliability and/or operational problems. Reliability problems result when the electric field generates very energetic or 'hot' carriers. The hot carriers are injected into the gate oxide, degrading the gate oxide quality. Operational problems result when the electric field is high enough to result in avalanche ionization. In avalanche ionization, a few carriers receive enough energy to generate other carriers, which in turn receive enough energy to generate even more carriers, and so on.

The avalanche ionization effect is a particular problem in SOI (silicon-on-insulator) devices. The reason for this is that in SOI devices, the active area is separated from the bulk of the wafer by an electrical insulator (e.g. silicon oxide, silicon nitride, or sapphire). Thus, the body of the device is at a floating electric potential. Since the body is floating, minority carriers (holes in n-channel devices, electrons in p-channel devices) collect in the body, near the source/body junction. For example, in n-channel devices, when the hole concentration changes the body potential, electrons are injected from the source. Many of these electrons reach the drain, where they participate in impact ionization. The resulting positive feedback loop results in a runaway current at electric fields levels significantly below the junction breakdown voltage.

A number of approaches for improving the maximum operating voltage in a semiconductor device have been proposed. None of the proposed means for reducing the maximum operating voltage does so without increasing the resistance in the transistor. Most techniques require special tooling or difficult processing steps and are not readily applicable to SOI technology.

SUMMARY OF THE INVENTION

The invention is a process to form a poly sidegate LDD structure on buried channel MOSFETs. Key features of the process are that the poly spacer on the gate is not formed until after the source/drain process steps, that the poly that becomes the sidegate is doped before the poly spacer etch and that a blanket neutral impurity in silicon implant is used to short the sidegate to the normal gate of a transistor.

By forming the sidegate over the LDD region, the inventive process improves the maximum power supply voltage that can be used with the semiconductor devices. No special tools or difficult processing steps are required. The process is compatible with buried channel devices including silicon-on-insulator technology. The technique avoids the disadvantages of previously known alternative methods and is not restricted to either thick or thin silicon films.

BRIEF DESCRIPTION OF THE DRAWINGS

The foregoing and other objects, features and advantages of the invention will be apparent from the following more detailed description of the preferred embodiment of the invention as illustrated by accompanying drawings.

DESCRIPTION OF THE PREFERRED EMBODIMENTS

Figure 1:
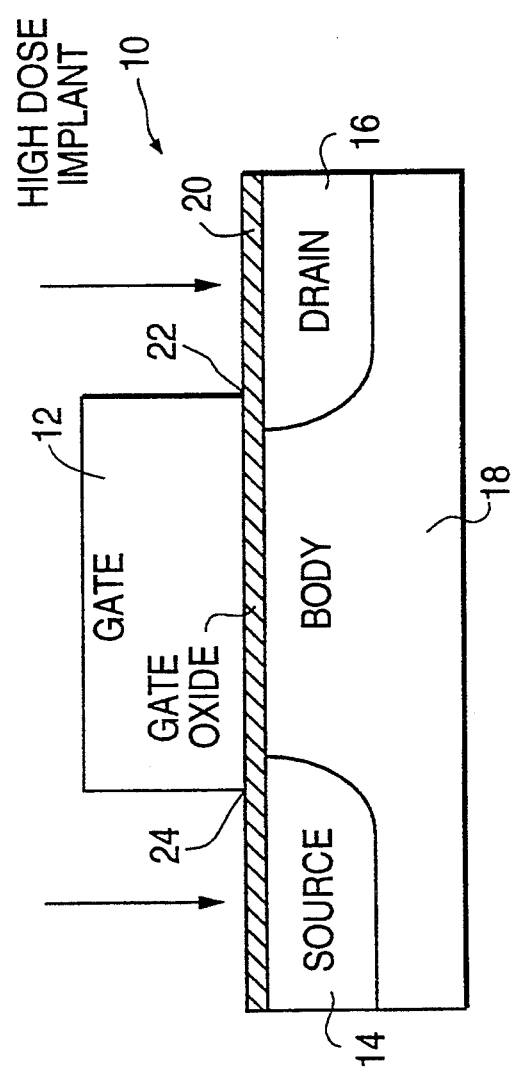
FIG. 1 is a cross section of a typical source/drain region of a MOSFET not having source/drain engineering.

Shown in FIG. 1 is a typical MOSFET having no source/drain engineering. MOSFET 10 contains a gate 12, and a drain 14, and a source 16, built within a body 18. The gate oxide 20 lies under the gate 12 and overlays the source and drain regions 14 and 16. To form the source and drain regions a high dose implant of the appropriate dopant is implanted through the source drain region and may be also implanted through the source drain region and may be also implanted into the gate region 12 in a self-aligned manner. As the size of the semiconductor devices are steadily scaled down, the physics of the scaling laws give rise to the major limiting factor that of the presence of a high electric field. The highest electric field tends to be around the body/drain junction near the silicon/silicon dioxide interface just below the gate edge. This region is shown as area 22 and is similar to area 24 between the source and the gate on the other side of the transistor body 18.

One approach to limit the electric field near the body/drain junction for SOI devices is to add additional contacts to tie the body of the transistor to ground. This can be implemented either by tying the body to the source or by the use of additional contacts. However, this approach has several limitations. First, is that the body tie approach is efficient only in relatively thick silicon films, many of the performance advantages of SOI technology are obtained only with very thin silicon films. Another disadvantage of the body tie approach is the number of 'straps' tying the body to the drain is a strong function of channel length. As the channel length is scaled down, well into the deep submicron regime, a large number of straps are needed across the width of the device, causing a large penalty in device area (or an increase in device resistance).

Figure 2A:
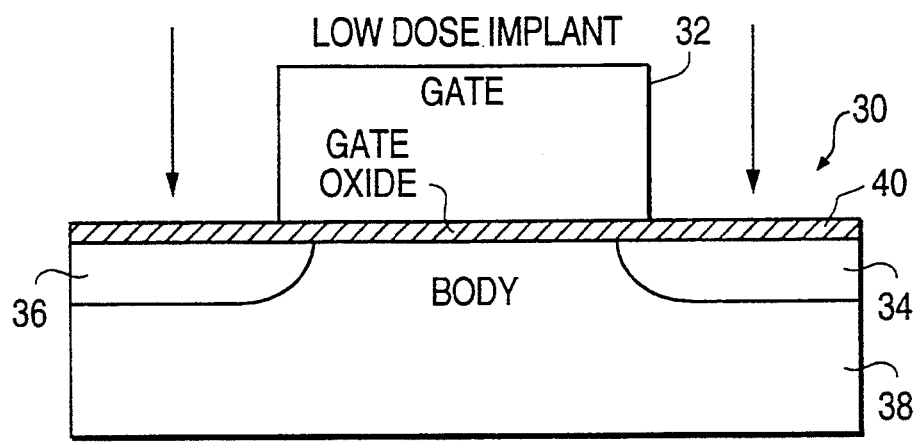
FIGS. 2a through 2c show a prior art standard LDD process.
Figure 2B:
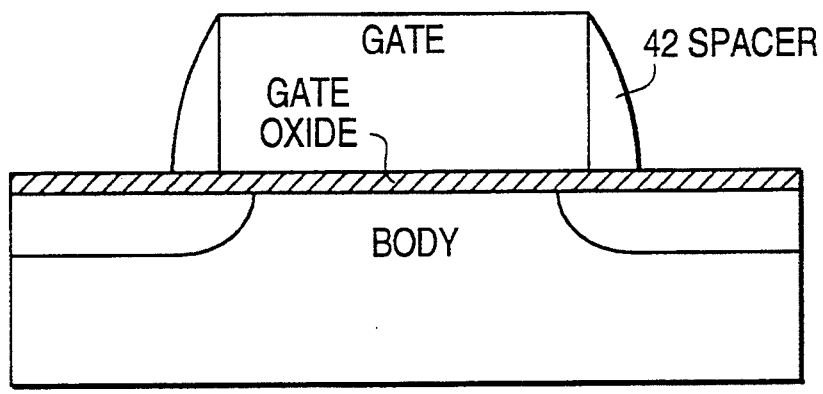
Figure 2C:
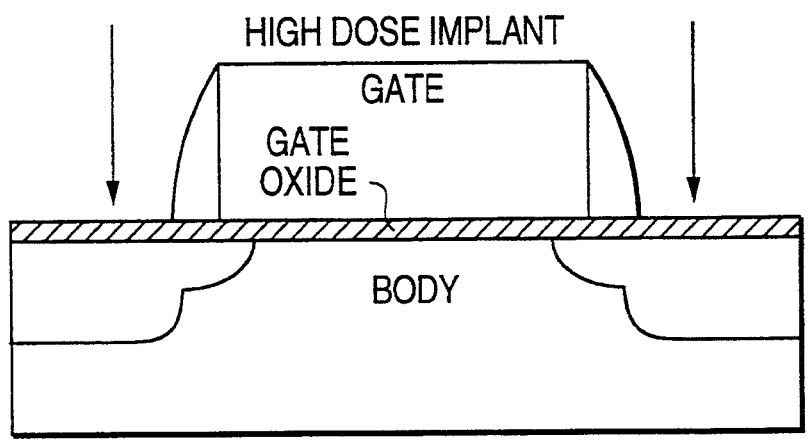

Another method of increasing the maximum operating voltage is the use of an LDD (Lightly Doped Drain). This consists of putting a moderately doped region between the body/drain and the body/source junction, this is shown in FIG. 2 wherein the transistor 30 consists of a gate region 32, a drain region 34 and a source region 36, built upon a body 38. The gate oxide 40 lies beneath the gate and over the source and drain regions. In this technique as shown in FIG. 2a a low dose implant is used to form the source and drain regions in a self aligned manner. The gate material 32 acts as an implant masking material. Next, as shown in FIG. 2b a spacer material 42 is placed on each side of the gate region. This can be a deposited conformal coating with an anisotropic etch back to form a sidewall spacer. Once a spacer is in place a high dose implant of the drain and source region is performed as shown in FIG. 2c. As can be seen however, this approach is not much different than putting an resistor between the body and the contacts of the source drain region. As a result, the LDD improves the maximum operating voltage at the cost of significantly degrading the transistor resistance.

Figure 3A:
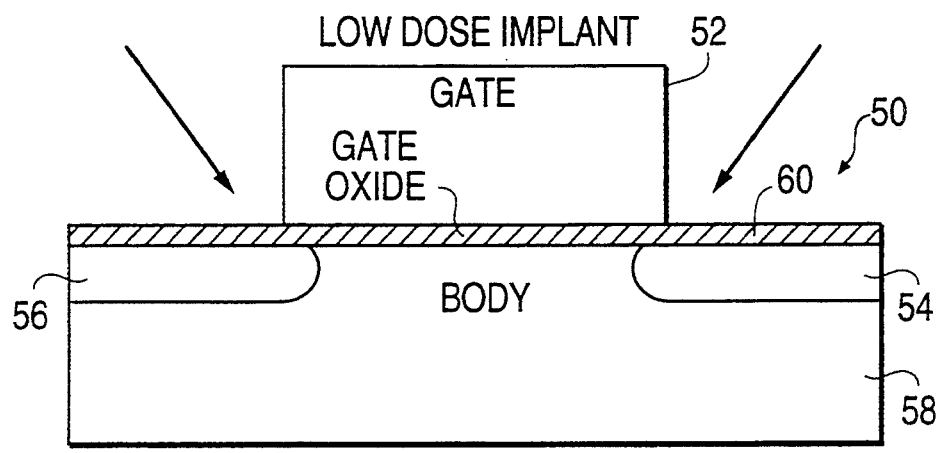
FIGS. 3a through 3c show a high dose implant for a MOSFET at a large angle tilt.
Figure 3B:
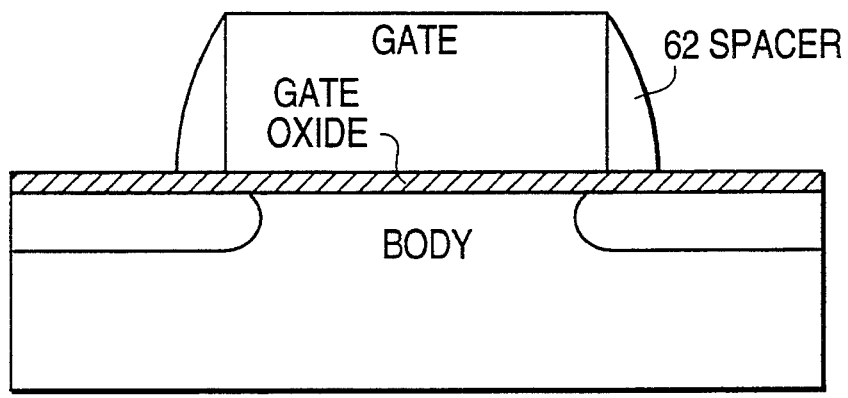
Figure 3C:
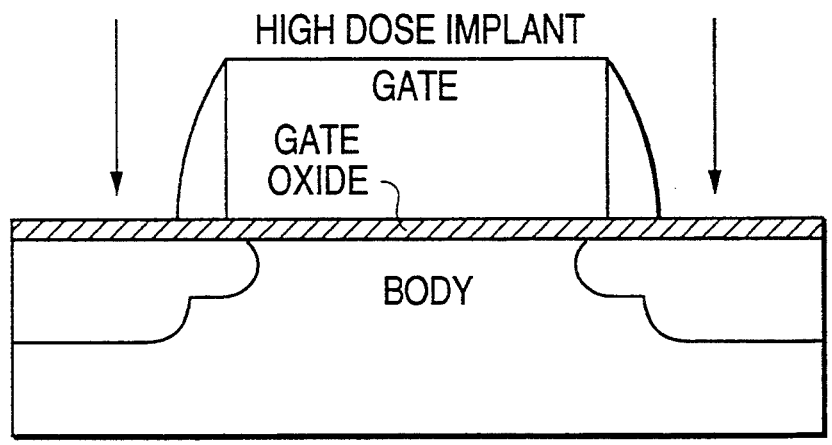

To overcome the drain current reduction various GOLDD (gate overlapped LDD) approaches have been proposed. These approaches seek to minimize device resistance by placing the gate over the higher resistant portion of the drain. One method of doing this is shown in FIG. 3. The method includes a transistor 50 having a gate region 52, drain region 54, source region 56 and the body 58 under a gate oxide 60. A first low dose implant is performed on the device to form the source and drain region at a large angle of tilt. Such a process is known as LATID (Large Angle Tilt Implant Device). Next, as shown in FIG. 3b a spacer 62 is formed which may be a conformal coating with an anisotropic etchback. Then a high dose implant is done on the semiconductor device as shown in FIG. 3c.

In the LATID technique, the overlap is obtained by performing the LDD implant at a very large angle, so that the implanted species ends up below the gate. One drawback of this method is that the LDD implant is performed through the edge of the gate oxide, potentially damaging this very sensitive surface interface area of the oxide. Another drawback is that not all integrated circuit manufacturers have the capability of implanting at a large angle.

Figure 4A:
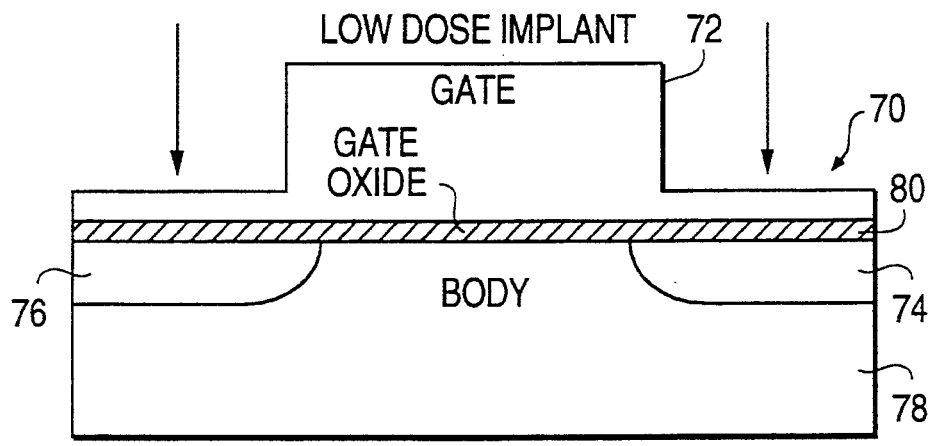
FIGS. 4a through 4c show a high dose implant for a MOSFET having an inverse T-gate with a side spacer.
Figure 4B:
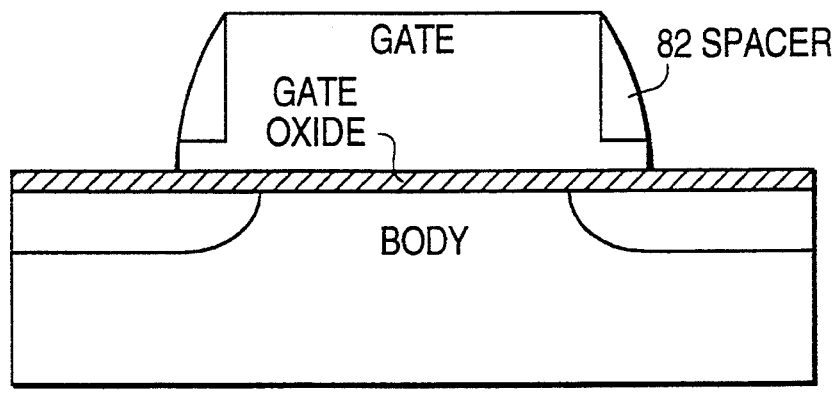

Another method is shown in FIG. 4 which employs an inverse T-gate structure which in addition to implanting through the gate oxide, has the drawback that it is very difficult to fabricate in a production facility due to etching tolerances of the gate region left above the drain and source regions. As shown in FIG. 4a, transistor 70 has a gate region 72, a drain region 74 and a source region 76, built upon a body 78. The gate oxide 80 has over it a thickness of gate material which has been thinned down to allow for implantation to readily penetrate to the drain/source regions.

Figure 4C:
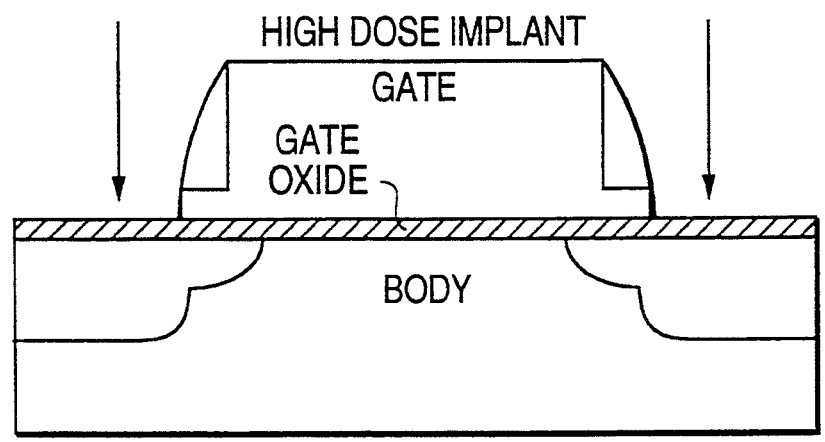
Figure 5A:
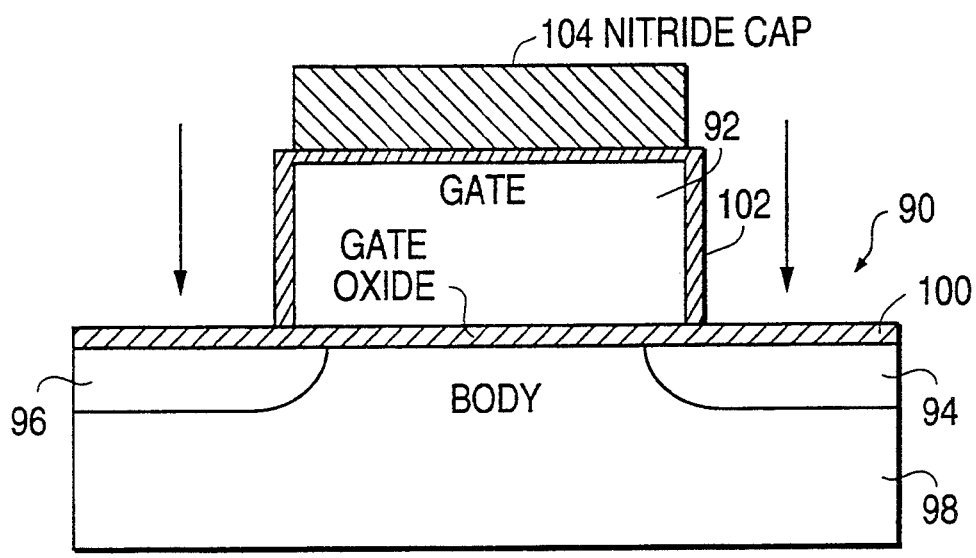
FIGS. 5a through 5d show a gate doping process employing a nitride cap and a nitride spacer as per the present invention.
Figure 5B:
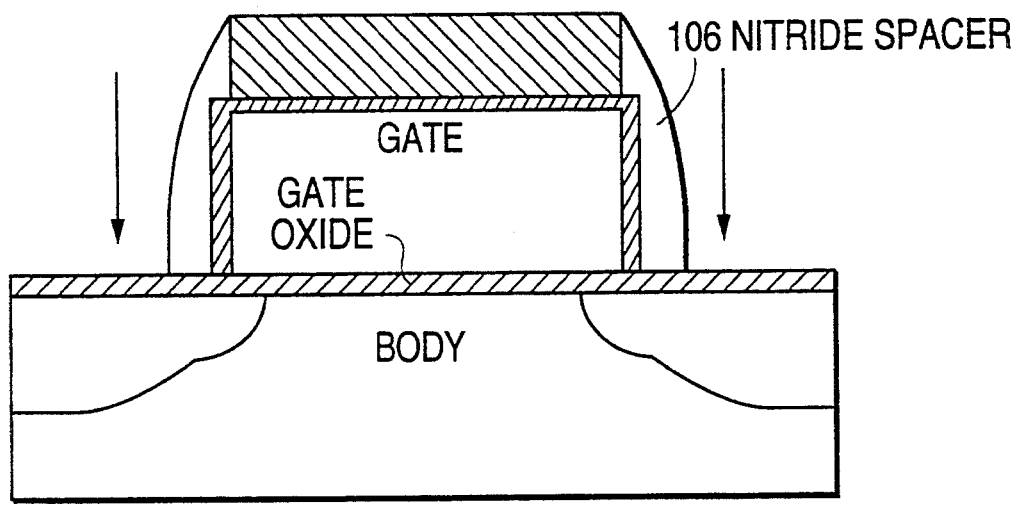
Figure 5C:
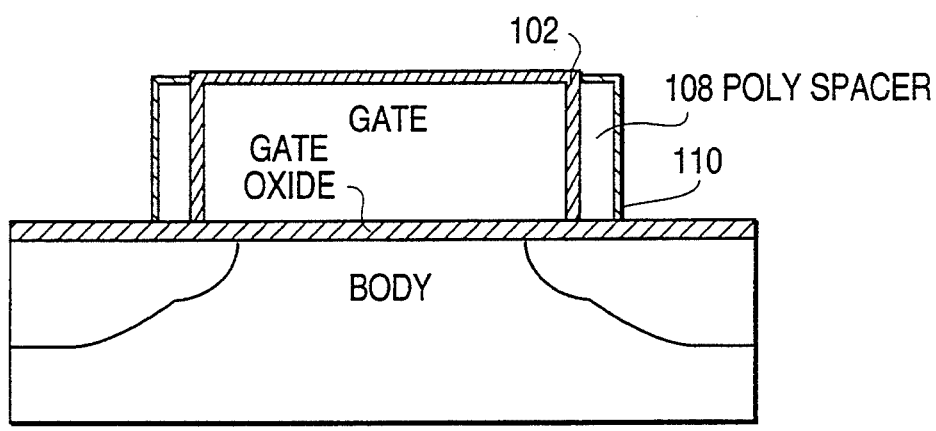
Figure 5D:
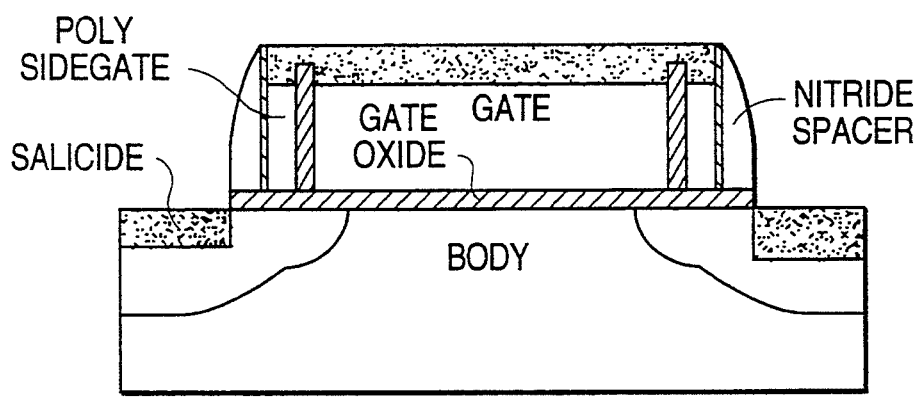

A low dose implant is shown being made with the inverse T-gate in FIG. 4a. Next, a spacer 82 of conformal material with an anisotropic etchback is placed over the gate region, this spacer is used as an etchback mask for the remaining gate material over the drain and source regions and acts as a spacer to prevent high dose implantation as shown in FIG. 4c to penetrate the edges of the gate to the source/drain regions.

Still another approach is to use polysilicon sidegates in which after an LDD implant polysilicon spacers are added to the normal polysilicon gate. These spaces are than shorted to the gate. However, the polysilicon sidegate approach can be only applied to surface channel devices in which the source and drain and the polysilicon gate are of the same dopant type. This allows one to use a blanket implant during which the sidewall oxide is damaged sufficiently to short the poly spacer to the normal gate. However, this process cannot be applied to buried channel MOSFETs, which have a poly gate of different dopant type than the source/drain. The buried channel device is of significant interest, because of the performance enhancements which it provides. A technique useful for buried channel devices to prevent high electric field is desired. The present invention provides a process to form a poly sidegate LDD structure on buried channel MOSFETs. The process provides a poly spacer after the source/drain formation. That is the poly spacer is not formed until after the LDD implant, the spacer implant and the high dose implant. The poly that becomes the side gate is doped before the poly spacer etch and a blanket neutral impurity implant is used to short the side gate to the normal gate.

The process listing for the steps needed for this gate overlap lightly doped drain for buried channel devices is as follows:

1. Deposition of polysilicon for gate.
2. Polyoxidation.
3. Photolithography and implant for n+ poly.
4. Photolithography and implant for p+ poly.
5. Deposition of nitride cap.
6. Definition of polysilicon gate.
7. Sidewall oxidation.
8. Photo definition and low dose phosphorous implant for n-channel devices.
9. Photo definition and low dose boron implant for p-channel devices.
10. Formation of implant spacer.
11. Photo definition and high dose arsenic implant to form n+ source and drains for n-channel devices.
12. Dopant activation anneal.
13. Photo definition and high dose boron implant to form p+ source and drains for p-channel devices.
14. Strip implant spacer and cap nitride.
15. Deposition of polysilicon.
16. Photo definition and high dose implant of boron to dope poly over n-channel devices.
17. Photo definition and high dose implant of phosphorous to dope poly over p-channel devices.
18. Etch polysilicon to form a spacer.
19. Polyoxidation.
20. Formation of nitride spacer.
21. Gate-to-spacer shorting implant (germanium, krypton, or argon).
22. HF dip to remove oxide on poly gate, poly sidegate, and source/drain regions prior to salicide formation.
23. Salicide formation.

The process is shown in FIGS. 5a through 5d. For transistor 50, a polysilicon gate 92 is defined using conventional photolithography and etch techniques. Immediately following the definition of the poly gate 92, a sidewall oxidation 102 is performed. The purpose of this oxide is to protect the side of the poly gate as well as increase the silicon dioxide thickness on the surface of the source and drain regions 94 and 96. This oxide is thin being <200 Angstroms. Next, a low dose phosphorous implant in the order of 1E13 cm-2 is implanted into the source/drain regions and the gate. The implant forms a low doped region within the source and drain. The LDD implant is followed by the formation of a disposable implant spacer 106. The implant spacer is fabricated by the deposition of CVD nitride followed by an anisotropic dry etch. It is important to use nitride since the cap on the poly gate is also made of nitride. This allows one to remove the cap nitride 104 and implant spacer 106 all in one etch step. Since this spacer blocks out the n+ implant from the source and drain region, it determines the width of the LDD region. Also being disposable, the spacers width can be modified to optimize the width of the LDD region. Following a n+ arsenic implant and dopant activation anneals, the polysidegate 108 is formed. This process begins with the deposition of polysilicon with a thickness equal to the desired poly sidegate width. The poly is then doped p+ with a low energy boron implant. Next, the poly is anisotropically etched, forming p+ polysilicon spacers on either side of the conventional p+ poly gate. The poly sidegates are then protected by growing a thin polyoxide 110. This is followed by the formation of the final nitride spacers by a conventional nitride deposition and anisotropic etch. At this point in the process the conventional and sidegates are both doped p+, but are electrically isolated by the sidewall oxide 102. The isolation is eliminated by implanting heavy neutral atoms, such as germanium, krypton, or argon. Heavy impurities must be used in order to sufficiently damage the sidewall oxide so that the side gates are shorted to the conventional gate 92. Neutral impurities must be used since this is a blanket implant, and it is undesirable to compensate either n+ regions with boron or p+ regions with arsenic. Finally an HF dip is used to remove oxide from all contact areas, so that a good low resistance salicide contact can be made.

Figure 6:
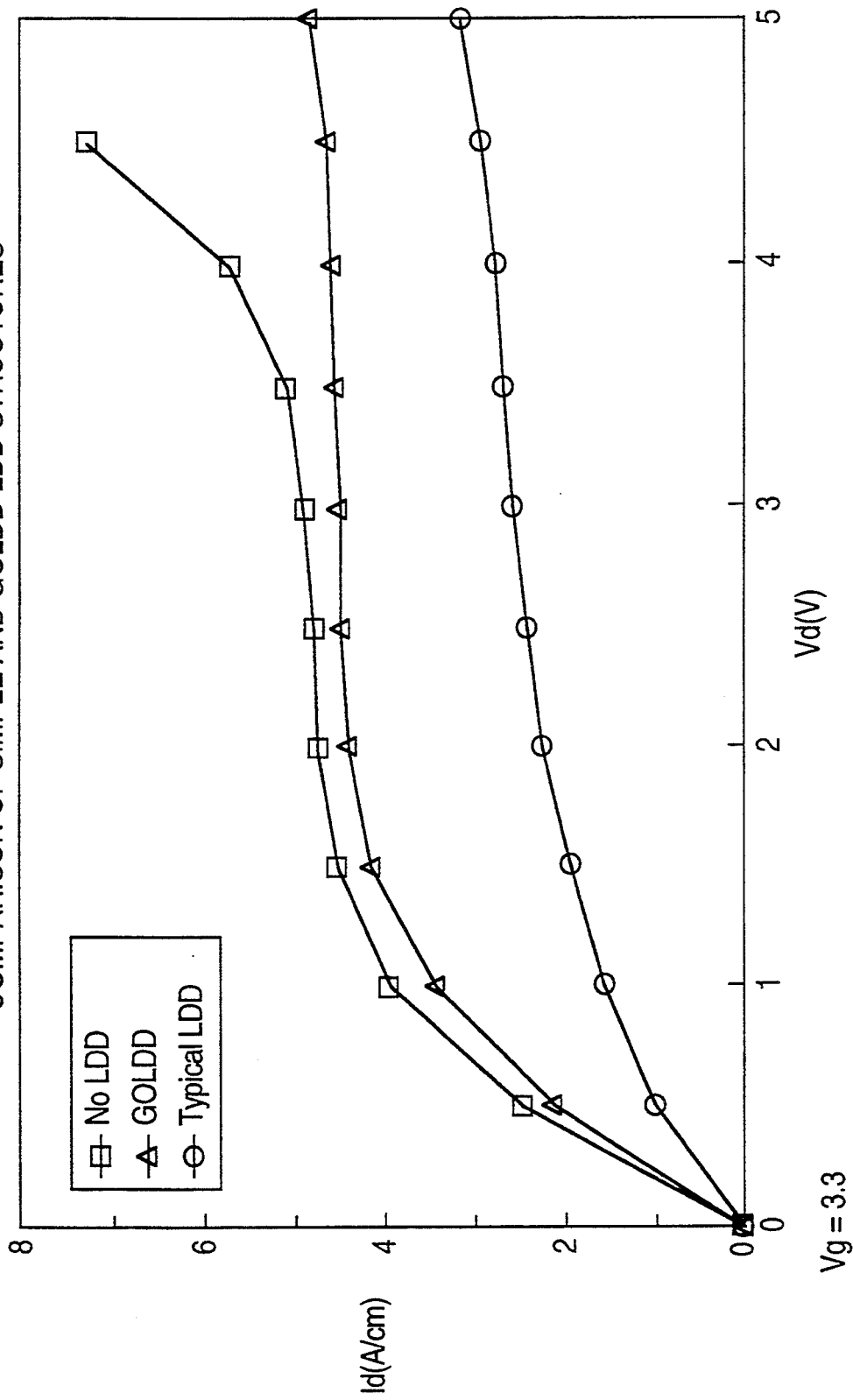
FIG. 6 shows the I-V characteristic for a buried channel transistor made according to the present invention.

The merits of this structure have been determined using a two dimensional device simulator. The simulator solves basic device physics equations to determine the current voltage characteristics of a semiconductor device. Simulated I-V curves for a transistor formed by the current process is shown in FIG. 6 for a conventional single drain device, a conventional LDD device and the gate overlap lightly doped drain structure of the present invention. As can be seen the GOLDD structure results in a breakdown voltage equivalent to an LDD device, but with the high drive current of a single drain device.

What has been shown is a gate overlapped lightly doped drain structure for buried channel devices. The process step delays the formation of the poly spacer until after the source/drain processing is completed. Then the poly gate becomes a part of the sidegate by doping the poly spacer edge via a blanket neutral impurity implant to short the sidegate to the normal gate.

While the invention has been particularly shown and described in reference to preferred embodiments thereof, it will be understood by those skilled in the art that the foregoing and other changes in form and detail can be made therein without departing from the spirit and scope of the invention. Different processing steps and sequences maybe employed to form the structure and processing method of the claimed invention.

What is claimed is:

1. A method of fabricating a semiconductor device, comprising the steps of:

forming a transistor structure having a gate electrode, source and drain regions and a gate oxide on a semiconductor substrate;

forming a nitride cap on an oxide layer over the gate electrode;

implanting first ions into the substrate to form an LDD layer in the substrate;

forming a nitride spacer over the gate electrode;

implanting second ions into the substrate to form source and drain regions containing the LDD layer;

stripping nitride cap and spacer material;

forming a polysilicon sidegate adjacent to the gate electrode;

forming a second nitride spacer adjacent to the polysilicon sidegates; and implanting heavy ions of a neutral conductivity type in silicon into the gate region to electrically short the gate electrode and polysilicon sidegate together.

2. The method of claim 1 wherein the device is a buried channel MOSFET.

3. The method of claim 2 wherein the device is formed on a SOI substrate.

* * * * *